United States Patent [19]
Umegaki

[11] Patent Number: 6,028,495
[45] Date of Patent: Feb. 22, 2000

[54] MAGNETOSTATIC-WAVE DEVICE

[75] Inventor: Toshihito Umegaki, Kyoto-fu, Japan

[73] Assignee: Murata Manufacturing Co., Ltd., Japan

[21] Appl. No.: 08/949,272

[22] Filed: Oct. 13, 1997

[30] Foreign Application Priority Data

Oct. 11, 1996 [JP] Japan .................................. 8-289325

[51] Int. Cl.⁷ .............................. H01P 1/218; H01P 1/32
[52] U.S. Cl. .......................... 333/24.1; 333/148; 333/202
[58] Field of Search ................... 333/1.1, 24.1, 333/148, 202, 24.2, 141, 142

[56] References Cited

U.S. PATENT DOCUMENTS

| | | | |
|---|---|---|---|
| 3,621,477 | 11/1971 | Bosma | 333/1.1 |
| 4,314,214 | 2/1982 | Castera et al. | 333/148 X |
| 4,465,986 | 8/1984 | Loh et al. | 333/148 |
| 4,978,956 | 12/1990 | Berresheim | 341/155 |
| 5,166,882 | 11/1992 | Stambaugh | 364/453 |
| 5,485,385 | 1/1996 | Mitsugi | 364/449 |
| 5,781,079 | 7/1998 | Okada et al. | 333/24.1 |

FOREIGN PATENT DOCUMENTS

| | | |
|---|---|---|
| 328730 | 8/1989 | European Pat. Off. . |
| 453726 | 10/1991 | European Pat. Off. . |
| 716315 | 6/1996 | European Pat. Off. . |
| 4125369 | 4/1992 | Germany . |

OTHER PUBLICATIONS

M. Tsutsumi, "Applications of Magnetostatic Wave to Microwave Devices", *MWE '92* Microwave Workshop Digest, pp. 231–236.

*Primary Examiner*—Paul Gensler
*Attorney, Agent, or Firm*—Ostrolenk, Faber, Gerb & Soffen, LLP

[57] ABSTRACT

A magnetostatic-wave device includes a dielectric substrate on which parallel first electrically conductive lines are formed. A magnetostatic-wave device formed of a gadolinium-gallium-garnet (GGG) substrate on which yttrium-iron-garnet (YIG) thin films are formed is disposed on the first electrically conductive lines. Crossed second electrically conductive lines are formed on a YIG thin film. Lands are formed at both ends of these electrically conductive lines and are connected to each other with bonding wire to form one electrically conductive line. Input and output ends are formed between both ends of this electrically conductive line and the ground.

15 Claims, 13 Drawing Sheets

$\lambda min$ : MINIMUM WAVELENGTH OF EXCITABLE MAGNETO-STATIC WAVE

─── : DISPERSION CURVE

─── : FREQUENCY BAND IN WHICH MAGNETOSTATIC WAVE IS EXCITED n = 0 : UNIFORM MODE IN YIG-WIDTH DIRECTION
n = 1 : FIRST-ORDER MODE IN YIG-WIDTH DIRECTION $\lambda min$ : MINIMUM WAVELENGTH OF EXCITABLE MAGNETO-STATIC WAVE

───── : DISPERSION CURVE

───── : FREQUENCY BAND IN WHICH MAGNETOSTATIC WAVE IS EXCITED $\lambda min$ : MINIMUM WAVELENGTH OF EXCITABLE MAGNETO-STATIC WAVE

——— : DISPERSION CURVE

——— : FREQUENCY BAND IN WHICH MAGNETOSTATIC WAVE IS EXCITED

FREQUENCY (MHz)

6,028,495

MAGNETOSTATIC-WAVE DEVICE

BACKGROUND OF THE INVENTION

1. Field of the Invention

The present invention relates to magnetostatic-wave devices, and more particularly, to a magnetostatic-wave device used for a signal-to-noise enhancer.

2. Description of the Related Art

FIG. 11 is a perspective view of a conventional magnetostatic-wave device 1. In the magnetostatic-wave device 1, first electrically conductive lines 3 parallel to each other are formed on a dielectric substrate 2, and a magnetostatic-wave device 4 is disposed on the lines 3. The magnetostatic-wave device 4 includes a gadolinium-gallium-garnet (GGG) substrate 5 and yttrium-iron-garnet (YIG) thin films 6a and 6b serving as ferri-magnetic substrates formed on both main surfaces of the substrate 5. Therefore, the first electrically conductive lines 3 are in contact with the YIG thin film 6a. On the YIG thin film 6b, second electrically conductive lines 7 which are parallel to each other are formed. The first electrically conductive lines 3 are connected to the second electrically conductive lines 7 with bonding wire 8 to form one electrically conductive line having an input end and an output end.

As shown in FIG. 12, the first electrically conductive lines 3 may be connected to the second electrically conductive lines 7 by bonding wire 8 being crossed to form two independent, electrically conductive lines.

In the magnetostatic-wave device 1, when a high-frequency signal is input to the input end while a DC magnetic field Ho is applied in parallel to the first and second electrically conductive lines 3 and 7, a high-frequency magnetic field is generated around the electrically conductive lines 3 and 7, and a magnetostatic wave is excited in the YIG thin films 6a and 6b. When an input signal has a low power, since most of the power is converted to a magnetostatic wave, no signal is output from the output end. Since the excitation of a magnetostatic wave is saturated when the power of an input signal reaches a certain level, if an input signal has a high power, a noise component in the signal, which has a low power, is not output but only the signal component thereof, which has a high power, is output. This means that the magnetostatic-wave device 1 operates as an S/N enhancer.

FIG. 13 shows a dispersion curve indicating the relationship between the propagation constant $2\pi/\lambda$ ($\lambda$: wavelength) and the frequency of a magnetostatic wave (MSW) in such a magnetostatic-wave device. When a DC magnetic field is applied in parallel to the YIG thin films, a magnetostatic surface wave (MSSW) in a uniform mode which propagates in the width direction of the YIG thin films, a magnetostatic surface wave (MSSW) in a high-order mode which propagates in the width direction of the YIG thin films, and a magnetostatic forward volume wave (MSFVW) are excited. These waves include infinite high-order modes. To simplify the descriptions thereof, only the zero-th order mode and the first-order mode are shown. "Applications of Magnetostatic Wave To Microwave Devices", Makoto Tsutsumi, MWE '92 Microwave Workshop Digest, explains an MSW and an MSSW.

In the magnetostatic-wave devices shown in FIG. 11 and FIG. 12, the minimum wavelength $\lambda_{min}$ of a magnetostatic wave which can be excited is proportional to the interval between the parallel electrically conductive lines 3 or that between the parallel electrically conductive lines 7. As the interval between electrically conductive lines is decreased, $\lambda_{min}$ becomes smaller and the propagation constant $2\pi/\lambda_{min}$ becomes larger. In this case, it is found from FIG. 13 that the frequency range of a magnetostatic wave which can be excited increases. Since the interval between electrically conductive lines has a lower limit, only a magnetostatic wave having a frequency, for example, in the range indicated by a thick line in FIG. 13 can be excited in a conventional apparatus. In other words, only noise components having frequencies in a limited range can be removed from an input signal. As shown in FIG. 14, noise components are greatly attenuated at discrete frequency ranges, and a frequency range in which noise can be removed becomes narrow. FIG. 15 is a graph showing an experimental result of an insertion loss-frequency characteristic of the magnetostatic-wave device shown in FIG. 11. The input power was set to −40 dBm, which is sufficiently lower than the saturation level. It is found from FIG. 15 that the frequency range width in which an insertion loss of 5 dB or more was obtained is 20 MHz. In addition to the foregoing problems, the wire used for connecting the first and second electrically conductive lines is required to be crossed and to have no electrical connection in the magnetostatic-wave device shown in FIG. 12, and machining therefore is difficult.

SUMMARY OF THE INVENTION

Accordingly, it is an object of the present invention to provide a magnetostatic-wave device having a wide frequency range and a simple structure.

The foregoing object is achieved in one aspect of the present invention through the provision of a magnetostatic-wave device including: a substrate; a ferri-magnetic member deposited on a part of the substrate for receiving an external magnetic field; a signal line in which at least a pair of line sections is functionally coupled with the ferri-magnetic member such that the pair opposes each other; a signal input section connected to one part of the signal line; and a signal output section connected to another part of the signal line; wherein a part of the signal line opposes another part of the signal line on the ferri-magnetic member such that they are substantially not parallel.

The magnetostatic-wave device may further include: a second ferri-magnetic member deposited on another part of the substrate for receiving an external magnetic field; and a second signal line in which at least a pair of line sections is functionally coupled with the second ferri-magnetic member such that the pair oppose each other, and the pair are connected to the signal line.

The foregoing object is achieved in another aspect of the present invention through the provision of a magnetostatic-wave device including: a substrate; a ferri-magnetic member deposited on a part of the substrate for receiving an external magnetic field; a signal line in which at least a part and another part of the signal line are functionally coupled with the ferri-magnetic member such that they oppose each other substantially in parallel; a signal input section connected to one part of the signal line; and a signal output section connected to another part of the signal line; wherein the signal line is disposed such that the distance between at least two adjacent, opposing parts of the signal line changes.

With the above structure, various intervals can be specified between electrically conductive lines on a ferri-magnetic member. Therefore, the frequency range of a magnetostatic wave to be excited is extended. In other words, $\lambda_{min}$ is small at portions where electrically conductive lines are crossed or closed, and $\lambda_{min}$ becomes larger as the line interval is gradually increased in the other places. Therefore, the frequency range of an excited magnetostatic wave is extended in the apparatus as a whole. This means that an S/N enhancer which can remove noise in a wide frequency range is provided.

The foregoing object, other objects, features, and advantages of the present invention will become clearer by the following detailed descriptions of embodiments noted by referring to the drawings.

DESCRIPTION OF THE PREFERRED EMBODIMENTS

Figure 1:
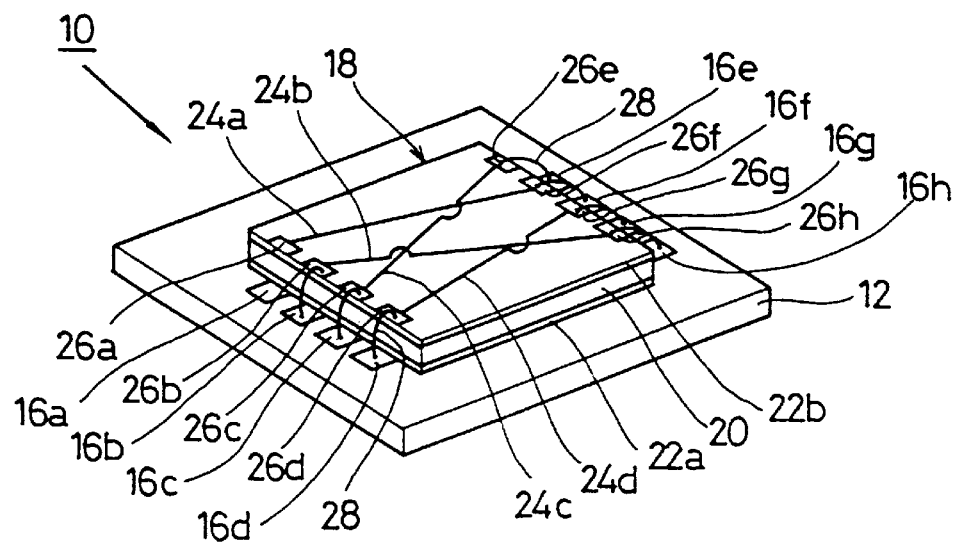
FIG. 1 is a perspective view of a magnetostatic-wave device according to an embodiment of the present invention.
Figure 2:
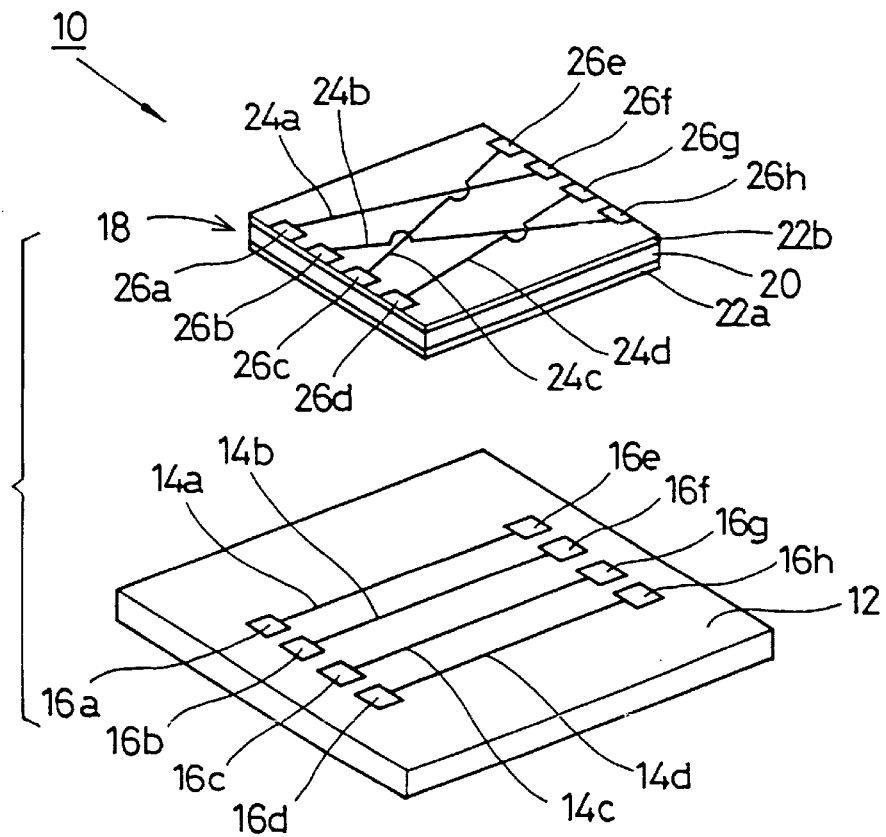
FIG. 2 is an exploded perspective view of the magnetostatic-wave device shown in FIG. 1.
Figure 3:
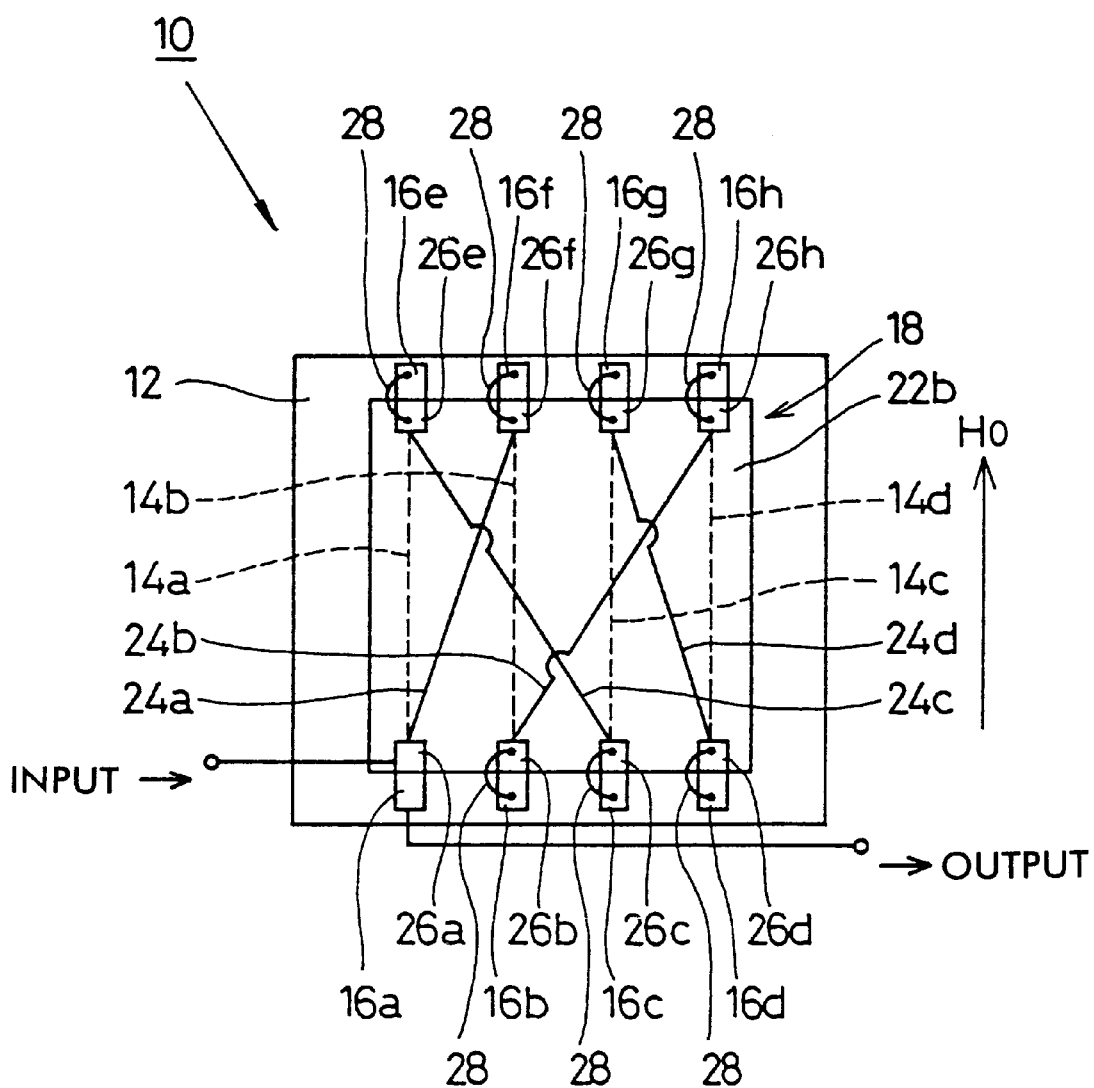
FIG. 3 is a plan of the magnetostatic-wave device shown in FIG. 1.

In FIGS. 1–3, a magnetostatic-wave device 10 according to the present invention includes a dielectric substrate 12. On the dielectric substrate 12, for example, four first electrically conductive lines 14a, 14b, 14c, and 14d are formed by deposition such that they are parallel to each other. At opposite ends of these electrically conductive lines 14a to 14d, lands 16a, 16b, 16c, 16d, 16e, 16f, 16g, and 16h are formed with an electrically conductive material.

A magnetostatic-wave device 18 is placed on the first electrically conductive lines 14. The device 18 is formed of a substrate 20 of which ferri-magnetic base members 22a and 22b are formed on opposite main surfaces. A gadolinium-gallium-garnet (GGG) substrate is, for example, used as the substrate 20, and yttrium-iron-garnet (YIG) thin films are, for example, used as the ferri-magnetic base members. Therefore, a YIG thin film 22a is in contact with the first electrically conductive lines 14. On a YIG thin film 22b, for example, four second electrically conductive lines 24a, 24b, 24c, and 24d are formed by deposition. At opposite ends of these electrically conductive lines, lands 26a, 26b, 26c, 26d, 26e, 26f, 26g, and 26h are formed.

The electrically conductive line 24a is formed between lands 26a and 26f, the line 24b between lands 26b and 26h, the line 24c between lands 26c and 26e, and the line 24d between lands 26d and 26g. In other words, the second electrically conductive lines 24a to 24d are formed such that they are crossed. In the magnetostatic-wave device 10, the line 24a and the line 24c are crossed, and the line 24b is crossed over the lines 24c and 24d. Insulating films, for example, are formed in places where these lines are crossed such that they are not electrically connected to each other. Electrically conductive lines may be electrically connected in places where they are crossed, as required. Electrically conductive lines may be disposed in a YIG film.

Lands 16b to 16h for the first electrically conductive lines 14a to 14d are connected to lands 26b to 26h for the second electrically conductive lines 24a to 24d by bonding wires 28. In the magnetostatic-wave device 10, lands 16b and 26b, lands 16c and 26c, lands 16d and 26d, lands 16e and 26e, lands 16f and 26f, lands 16g and 26g, and lands 16h and 26h are connected, respectively. With these connections, the first electrically conductive lines 14a to 14d and the second electrically conductive lines 24a to 24d form a single electrically conductive line. Input and output ends are formed of both ends of this electrically conductive line and the ground. Namely, the input end is formed of land 26a and ground, and the output end is formed of land 16a and ground.

As shown in FIG. 3, a DC magnetic field $H_0$ is applied in parallel to the first electrically conductive lines 14a to 14d. A high-frequency signal is input to the input end of the electrically conductive line and a signal is output from the output end. When a signal is input to the input end, a high-frequency magnetic field is generated around the first electrically conductive lines 14a to 14d and the second electrically conductive lines 24a to 24d, and a magnetostatic wave is excited within the YIG thin films 22a and 22b.

Figure 4:
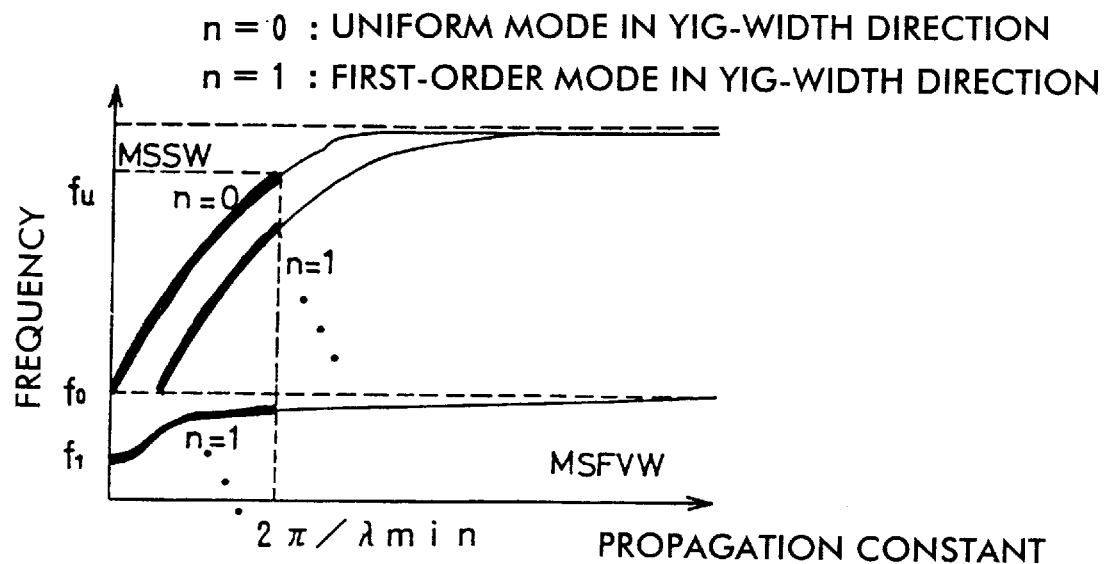
FIG. 4 is a graph indicating the relationship between the propagation constant and the frequency of a magnetostatic wave in the magnetostatic-wave device shown in FIG. 1.

FIG. 4 shows a dispersion curve indicating the relationship between the propagation constant $2\pi/\lambda$ and the frequency of an excited magnetostatic wave in the magnetostatic-wave device 10.

Since the second electrically conductive lines 24a and 24d are crossed, the interval between the electrically conductive lines is continuously changed. Therefore, a magnetostatic wave having continuous wavelengths $\lambda$ is excited. In addition, the minimum interval between electrically conductive lines can be made very small since the second electrically conductive lines 24a to 24d are crossed. This means that the minimum wavelength $\lambda_{min}$ of an excited magnetostatic wave can be made small. Therefore, the maximum propagation constant $2\pi/\lambda_{min}$ can be made large. As described above, since the maximum propagation constant can be increased and the wavelength range of the magnetostatic wave is wide, the frequency band width of an excited magnetostatic wave is extended as shown by thick lines in FIG. 4. Therefore, a frequency band where noise components are removed after being converted into a magnetostatic wave becomes continuously wide.

Figure 5:
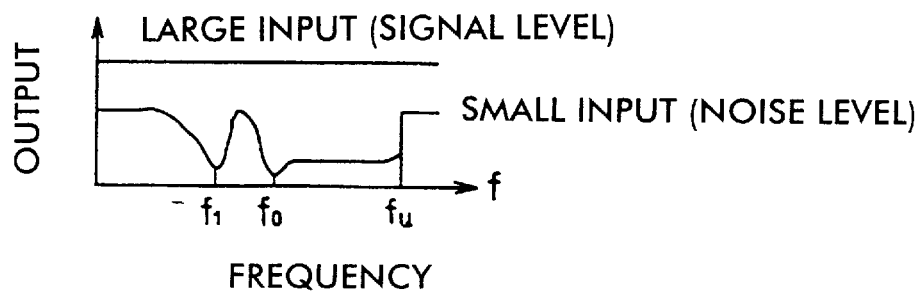
FIG. 5 is a graph indicating the output frequency characteristic of the magnetostatic-wave device shown in FIG. 1.
Figure 11:
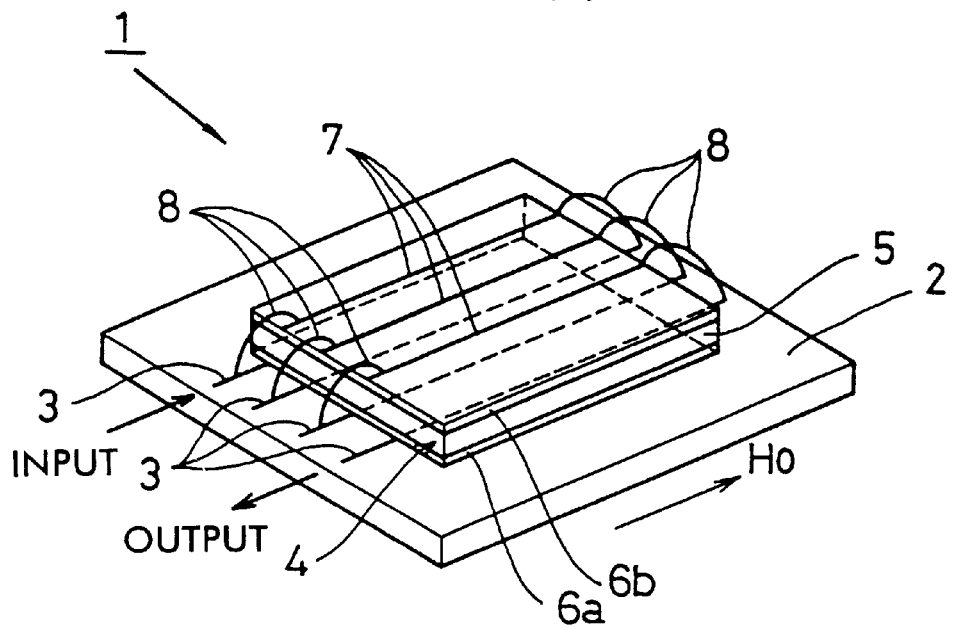
FIG. 11 is a perspective view of a conventional magnetostatic-wave device.
Figure 14:
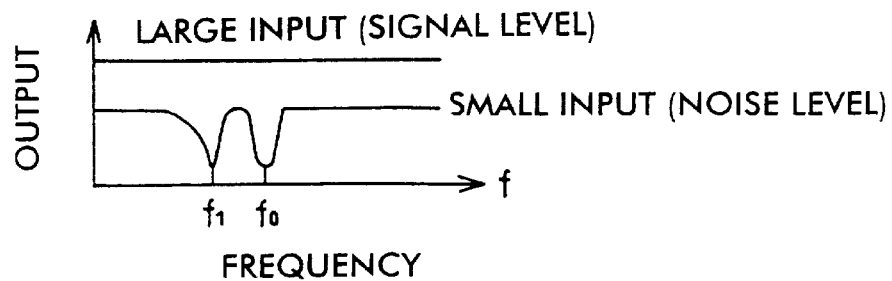
FIG. 14 is a graph indicating the output frequency characteristic of the conventional magnetostatic-wave device shown in FIG. 11.
Figure 15:
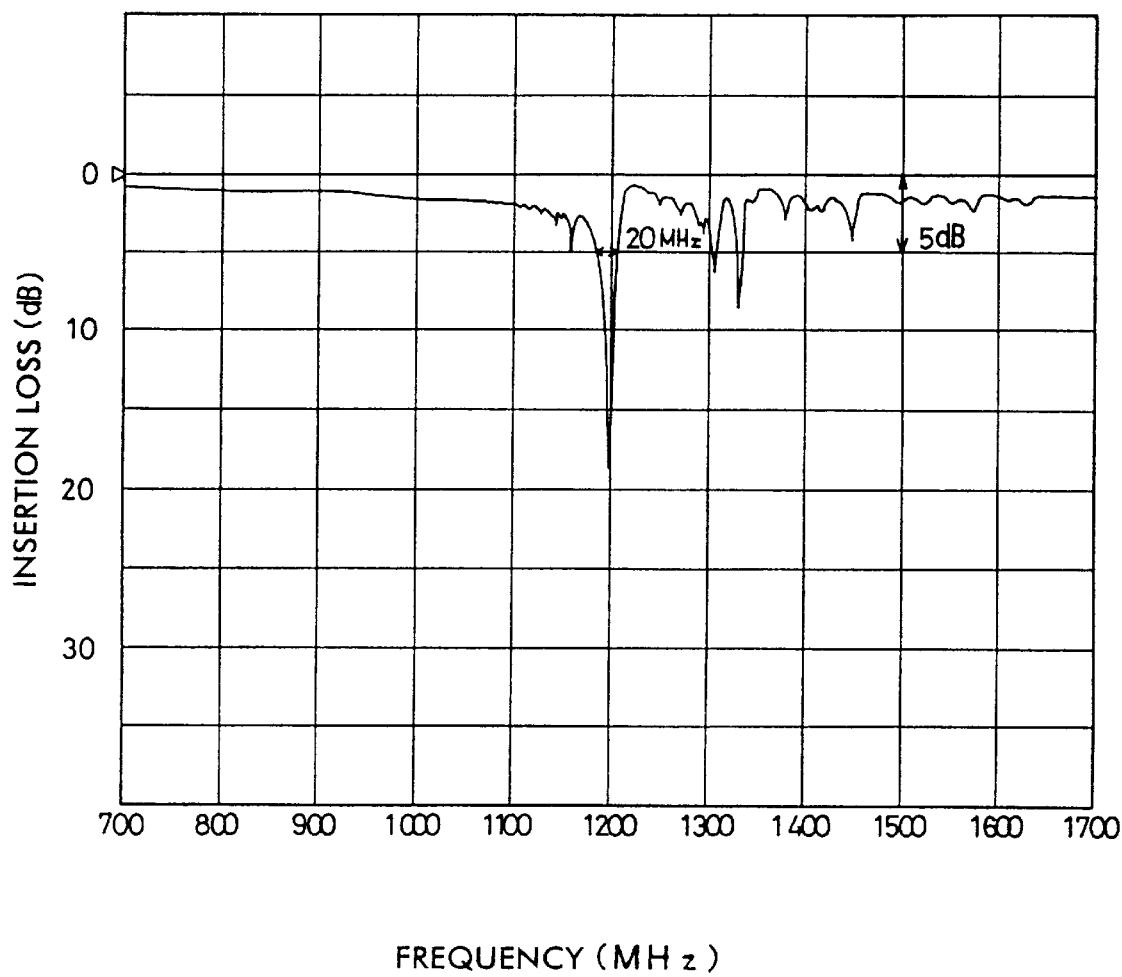
FIG. 15 is a graph indicating the relationship between the frequency and the insertion loss of the conventional magnetostatic-wave device shown in FIG. 11.

FIG. 5 is a graph showing the output frequency characteristics of the magnetostatic-wave device shown in FIG. 1. A comparison of FIGS. 5 and 14 (showing the output frequency characteristics of the prior art device of FIG. 11) shows that the frequency range in which noise can be removed with the present invention is significantly greater than that of the prior art device of FIG. 1.

Figure 6:
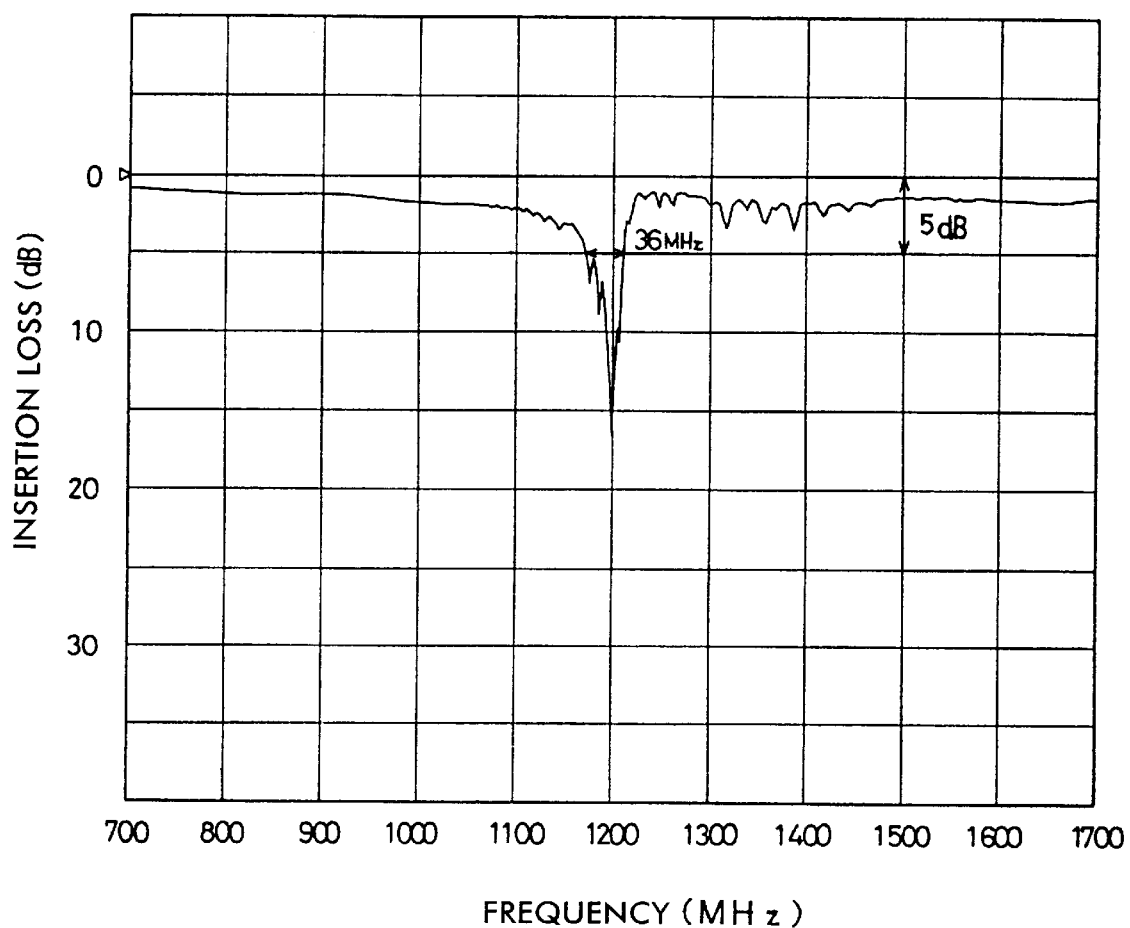
FIG. 6 is a graph indicating the relationship between the frequency and the insertion loss of the magnetostatic-wave device shown in FIG. 1.

FIG. 6 is a graph showing an insertion loss-frequency characteristic of the magnetostatic-wave device 10. The input power is set to −40 dBm, which is sufficiently smaller than the saturation level. It is determined from FIG. 6 that the width of the frequency band where an insertion loss of 5 dB or more is obtained is 36 MHz and noise can be removed at a wider frequency band than in a conventional magnetostatic-wave device.

Figure 7:
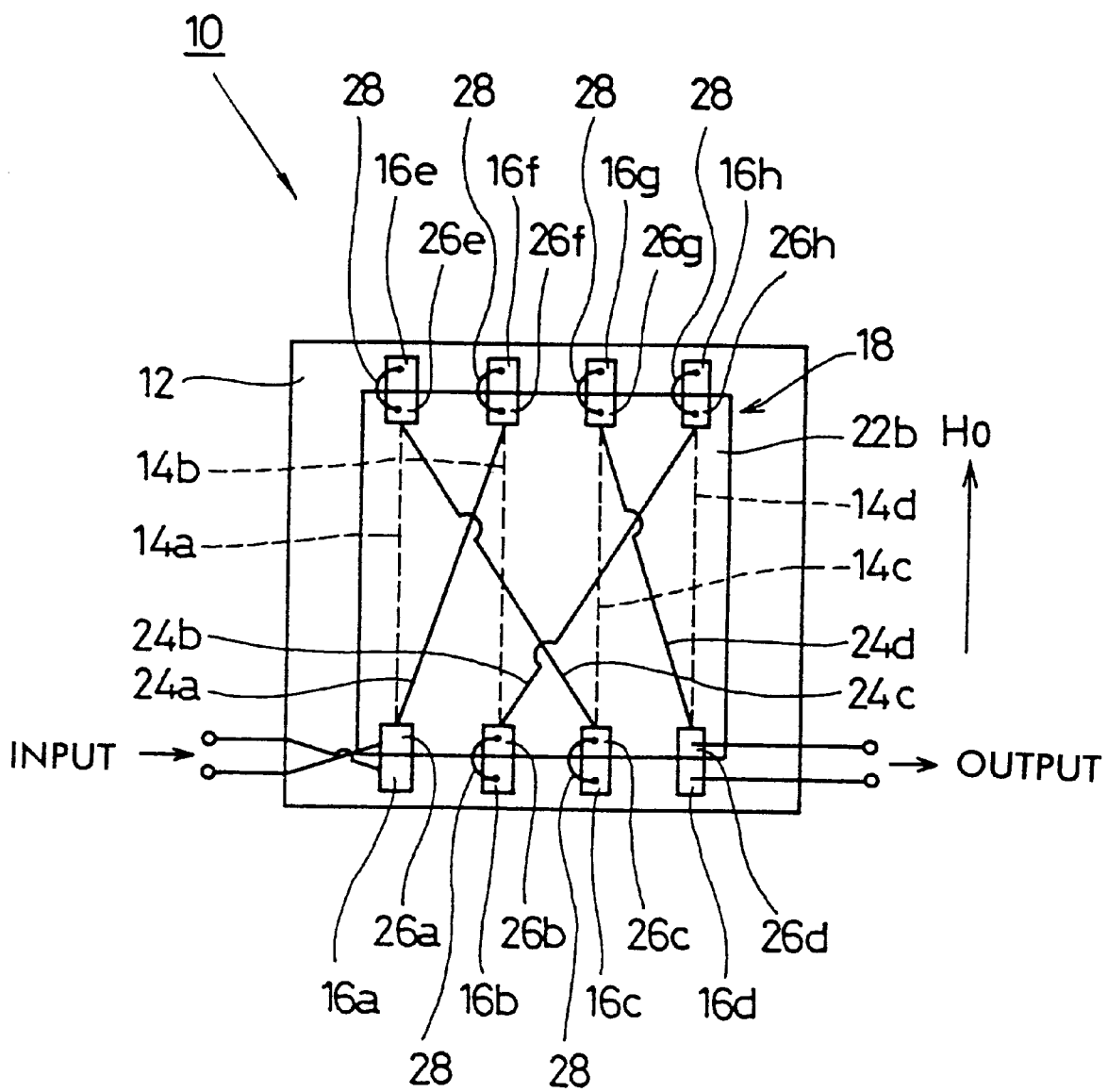
FIG. 7 is a plan of a magnetostatic-wave device according to another embodiment of the present invention.

A magnetostatic-wave device may have the same structure as the magnetostatic-wave device 10 shown in FIG. 1 except that lands 16d and 26d are not connected as shown in FIG. 7. In this case, first electrically conductive lines 14a and 14c and second electrically conductive lines 24c and 24d form one electrically conductive line, and first electrically conductive lines 14b and 14d and second electrically conductive lines 24a and 24b form another electrically conductive line. Both ends of these two electrically conductive lines are used as input and output ends. Lands 16a and 26a form the input end, and lands 16d and 26d form the output end.

Figure 8:
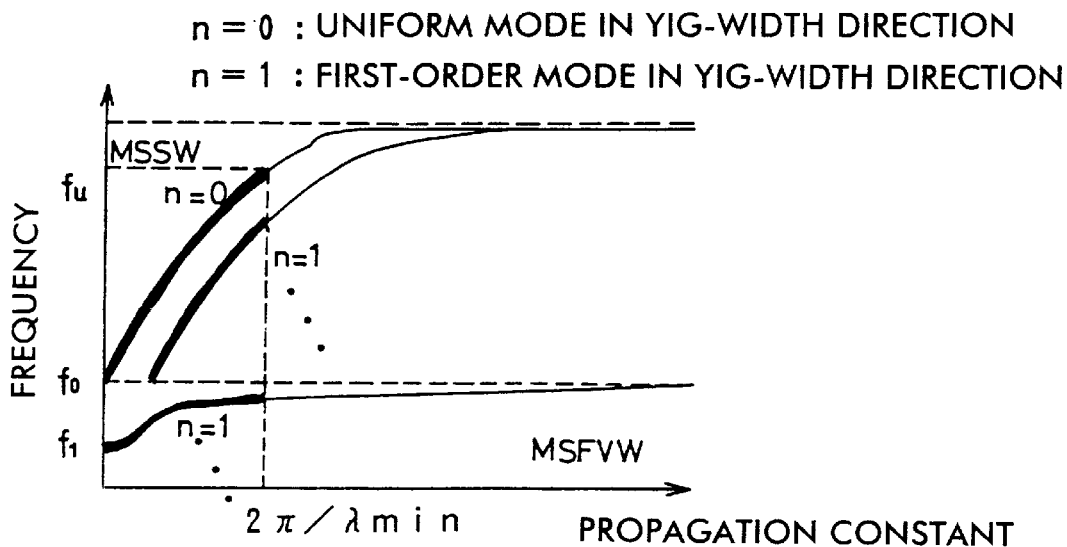
FIG. 8 is a graph indicating the relationship between the propagation constant and the frequency of a magnetostatic wave in the magnetostatic-wave device shown in FIG. 7.
Figure 9:
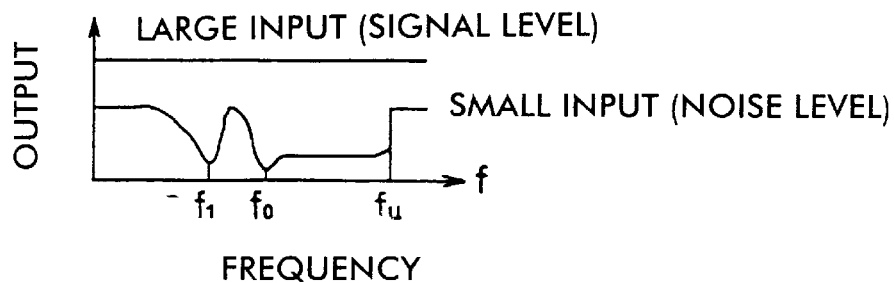
FIG. 9 is a graph indicating the output frequency characteristic of the magnetostatic-wave device shown in FIG. 7.
Figure 12:
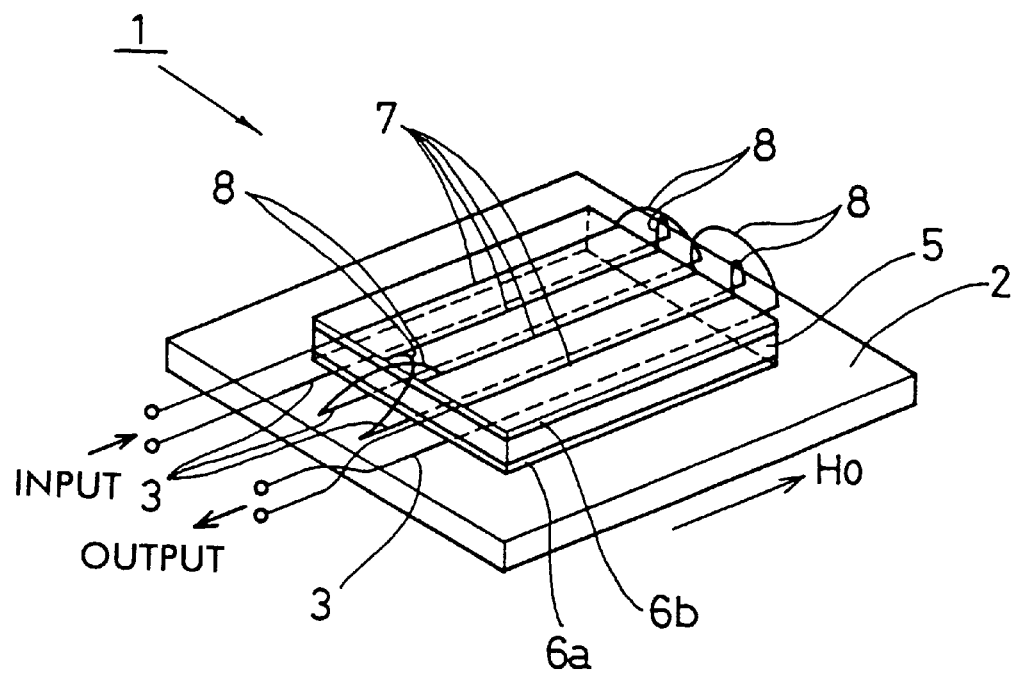
FIG. 12 is a perspective view of another conventional magnetostatic-wave device.
Figure 13:
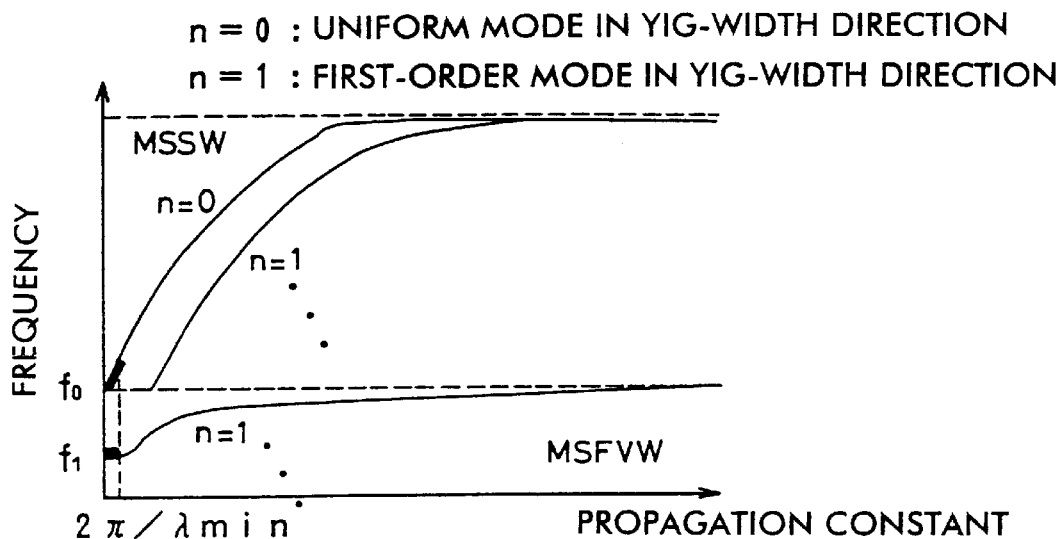
FIG. 13 is a graph indicating the relationship between the propagation constant and the frequency of a magnetostatic wave in the conventional magnetostatic-wave device shown in FIG. 11.

FIG. 8 and FIG. 9 show the characteristics of such a magnetostatic-wave device 10. Since the second electrically conductive lines 24a to 24d are crossed, this magnetostatic-wave device 10 can remove noise at a wide frequency band in the same way as in the magnetostatic-wave device 10 shown in FIG. 1. The two electrically conductive lines are formed to use a feeder method, and an insertion loss for a signal component is reduced. In addition, this magnetostatic-wave device 10 does not require the bonding wire 28 to be crossed as in the conventional magnetostatic-wave device shown in FIG. 12, and thereby electrically conductive lines are easily connected.

Figure 10:
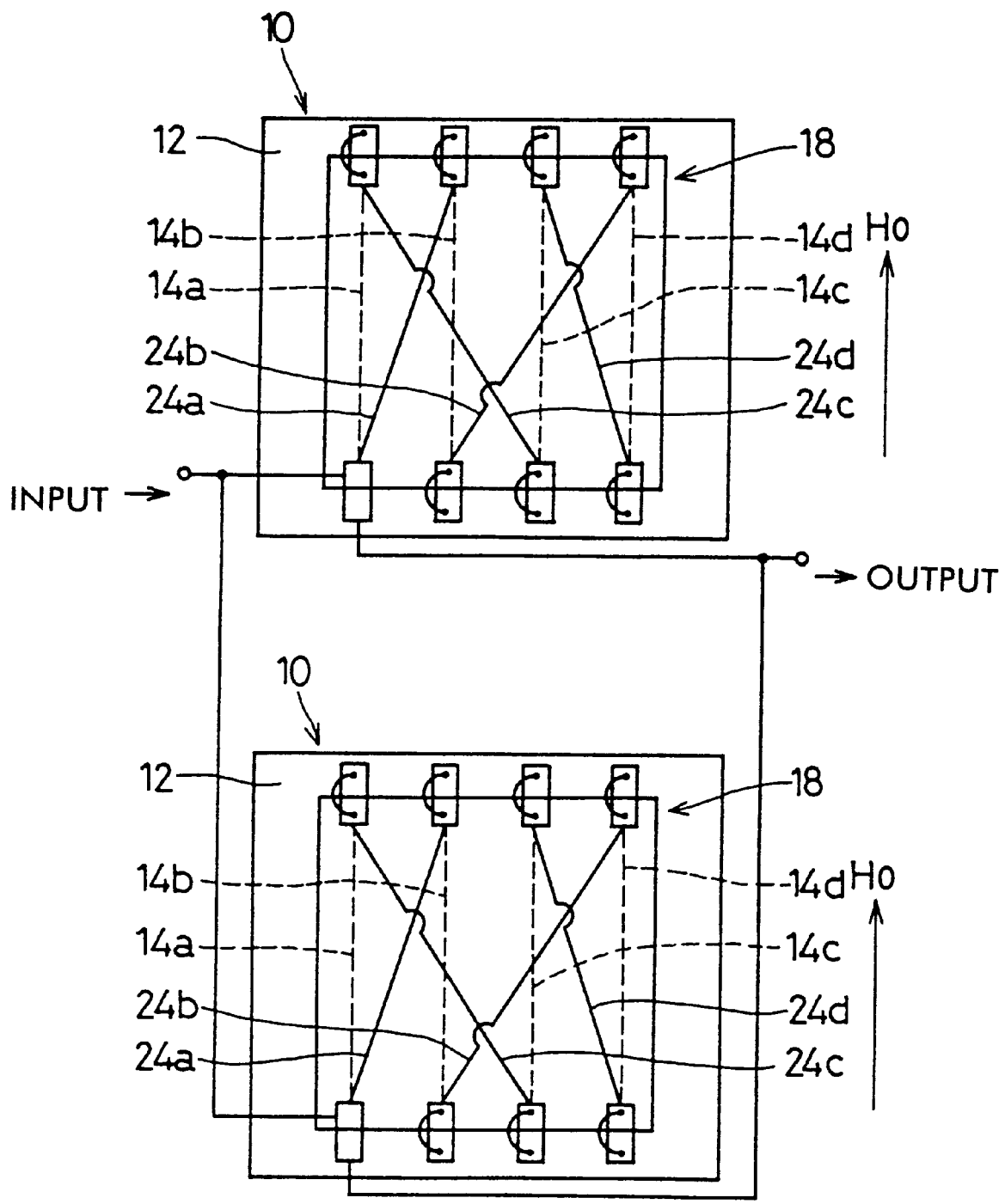
FIG. 10 is a view showing a case in which the magnetostatic-wave device shown in FIG. 1 is connected to the same apparatus in parallel.

Two magnetostatic-wave devices may be connected in parallel as shown in FIG. 10. The impedance thereof is reduced due to parallel connection. Therefore, the number of turns of electrically conductive lines can be increased and noise is attenuated more.

Although in the above magnetostatic-wave device 10, the YIG thin films 22a and 22b are formed on both surfaces of the GGG substrate 20, a YIG thin film may be formed on only one surface. In this case, a magnetostatic wave can be excited in the YIG thin film due to the first electrically conductive lines and the second electrically conductive lines, and noise components are removed.

Figure 16:
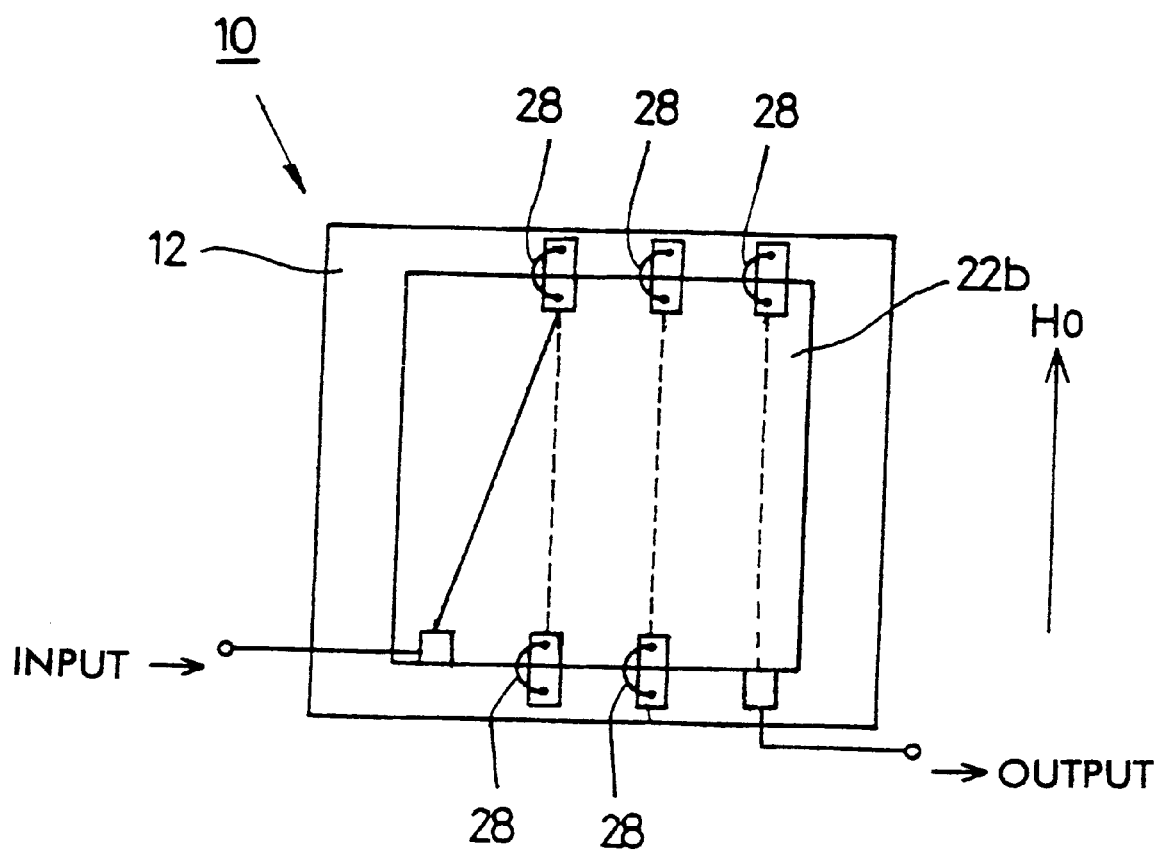
FIG. 16 is a plan of a magnetostatic-wave device according to still another embodiment of the present invention.

The first and second electrically conductive lines may be formed by winding conductive wire instead of deposition. It is also clear that the object of the present invention is achieved through a provision of a magnetostatic-wave device in which a part of the electrically conductive lines are crossed on a YIG thin film and the other lines are disposed in parallel. All the electrically conductive lines on the substrate 12 are not necessarily disposed in parallel. A part or all of them may be crossed in the same way as for the electrically conductive lines on the YIG thin film 22b. A magnetostatic-wave device may be configured as shown in FIG. 16 such that the interval between electrically conductive lines is changed according to a position on the YIG thin film without any crossing points of electrically conductive lines. Therefore, the electrically conductive lines are not necessarily straight and may have any shape such that the interval between the lines varies.

Figure 17:
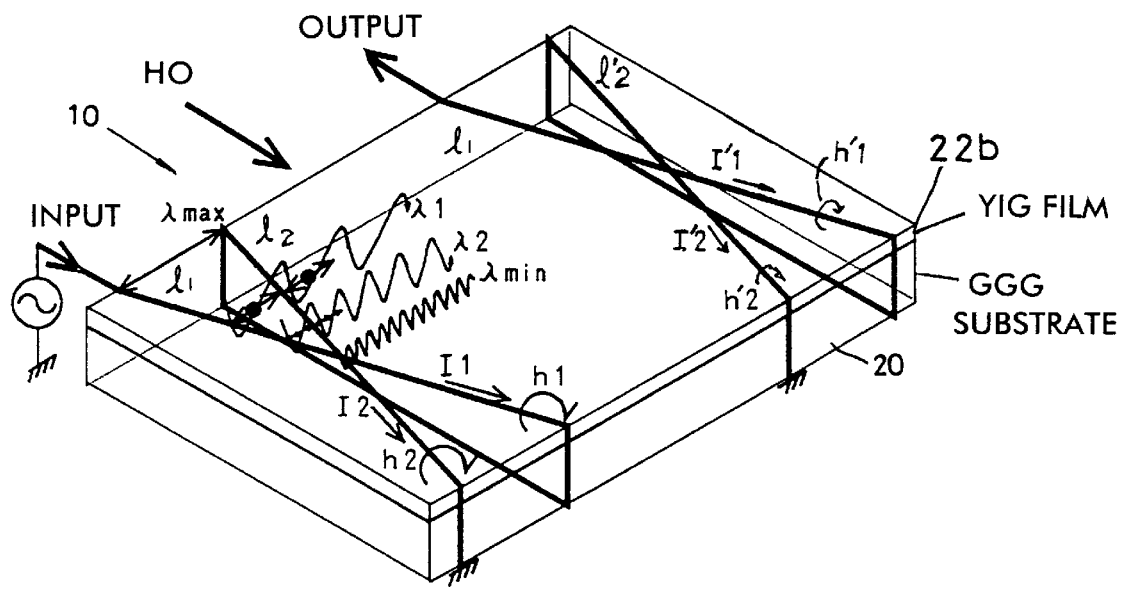
FIG. 17 shows a magnetostatic-wave device according to yet another embodiment of the present invention.
Figure 18:
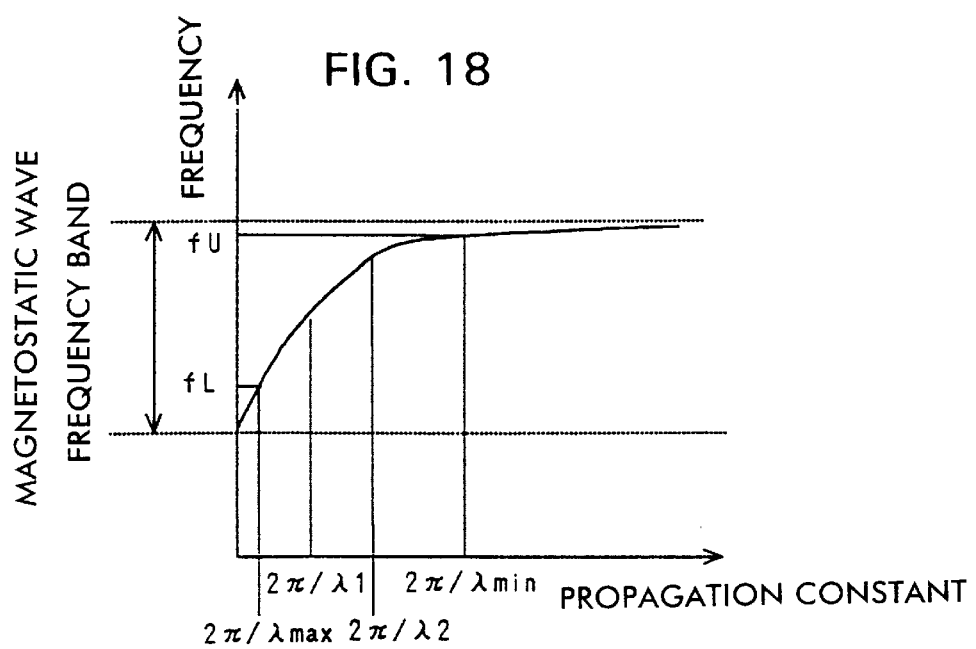
FIG. 18 shows a dispersion curve of magnetostatic waves in the magnetostatic-wave device shown in FIG. 17.

A structure shown in FIG. 17 may also be used. For simplicity, only a GGG substrate, a YIG thin film 22b formed thereon, and electrically conductive lines are shown in FIG. 17. When a high-frequency signal is input to an end of a line of which the other end is grounded, high-frequency currents $I_1$ and $I_2$ having the same phase flow through two sections $l_1$ and $l_2$ of the line which are crossed on a surface of the YIG film and generate high-frequency magnetic fields $h_1$ and $h_2$, respectively. With an input of a high-frequency signal in the magnetostatic-wave frequency band, the generated high-frequency magnetic fields $h_1$ and $h_2$ excite a magnetostatic wave having a very short wavelength $\lambda_{min}$ at the place where the line sections $l_1$ and $l_2$ are crossed and a magnetostatic wave with a wavelength having the same length as the distance between the line sections $l_1$ and $l_2$ at the other places. Therefore, magnetostatic waves having wavelengths of $\lambda_{min}$ to $\lambda_{max}$ are propagated in the apparatus shown in FIG. 17. These magnetostatic waves having wavelengths of $\lambda_{min}$ to $\lambda_{max}$ generate high-frequency magnetic fields $h_1'$ and $h_2'$ at two sections $l_1'$ and $l_2'$ of the output line. The high-frequency magnetic fields $h_1'$ and $h_2'$ generate high-frequency currents $I_1'$ and $I_2'$, and a high-frequency signal is generated at one end of the output line, of which the other end is grounded. Therefore, since the high-frequency signal is generated by the magnetostatic waves having wavelengths of $\lambda_{min}$ to $\lambda_{max}$, it is found from a dispersion curve shown in FIG. 18 that the signal has a frequency band ranging from $f_L$ to $f_U$. Because a magnetostatic wave having a very short wavelength is generated at the place where the line sections are crossed, the upper frequency of a magnetostatic wave which can be propagated increases and a wide-band filter characteristic is obtained.

Figure 19:
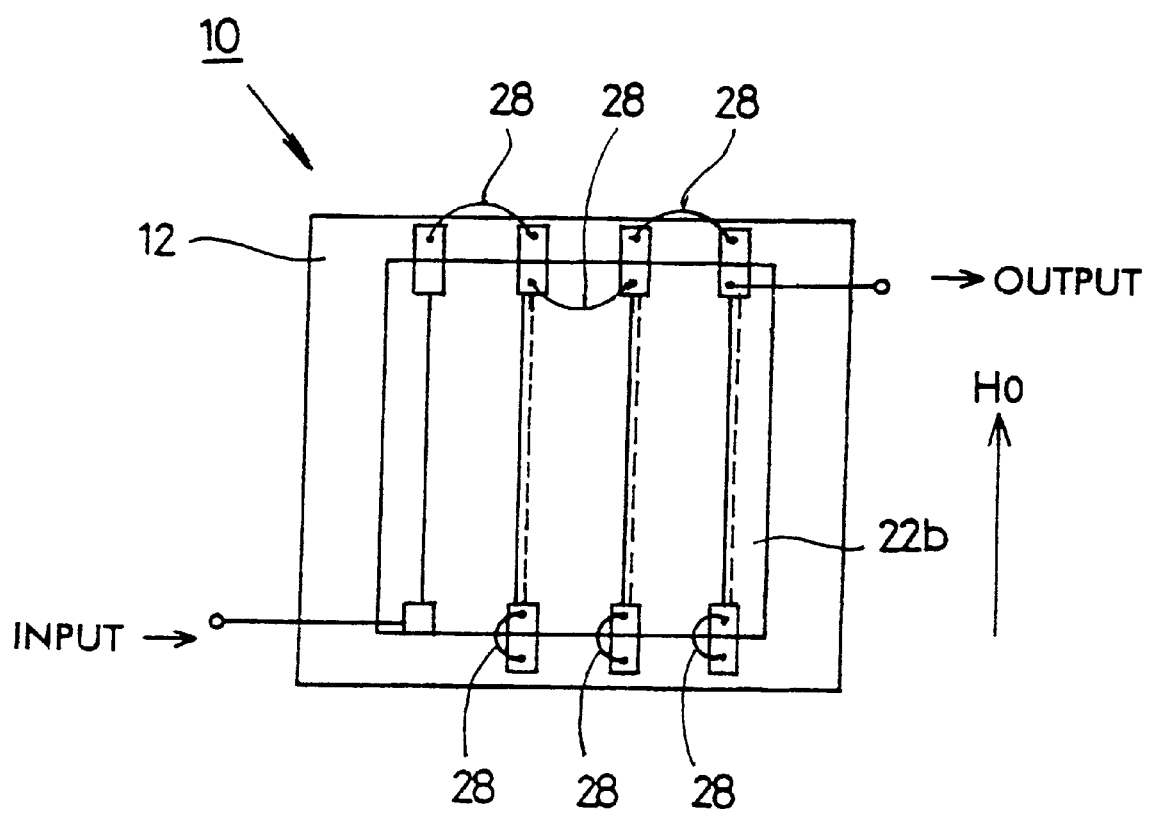
FIG. 19 is a plan of a magnetostatic-wave device according to a further embodiment of the present invention.

Electrically conductive lines may be formed as shown in FIG. 19 such that they are in parallel and have different intervals between adjacent lines on the YIG film. In FIG. 19, the interval-between the electrically conductive lines is different in the direction perpendicular to the direction of a magnetic field $H_0$.

What is claimed is:

1. A magnetostatic-wave device, comprising:

a substrate;

a ferri-magnetic member deposited on said substrate and having a generally planar major surface;

a signal line having an input end for receiving an electric signal applied thereto and an output end for outputting said electric signal after it has propagated through said signal line, said signal line including at least first and second line sections extending over said major surface and being functionally coupled to said ferri-magnetic member, said first and second line sections being non-parallel to one another; and a magnetic field generator for generating a DC magnetic field which is oriented along a direction substantially parallel to said generally planar major surface so that said signal is outputted at said output end of said signal line in a filtered form when said DC magnetic field is applied to said magnetostatic-wave device.

2. A magnetostatic-wave device according to claim 1, wherein said first line section crosses over said second line section.

3. A magnetostatic-wave device according to claim 2, wherein portions of said first and second line sections which cross over each other are insulated from each other.

4. A magnetostatic-wave device according to claim 1, wherein said ferri-magnetic member includes yttrium, iron, and garnet (YIG).

5. A magnetostatic-wave device according to claim 1, wherein said substrate includes gadolinium, gallium, and garnet (EGG).

6. A magnetostatic-wave device according claim 1, wherein said ferri-magnetic member is a first ferri-magnetic member and wherein said magnetostatic-wave device further comprises a second ferri-magnetic member deposited on a different portion of said substrate and having a generally planar major surface and wherein said signal line has at least third and fourth line sections extending over said major surface of said second ferri-magnetic member and being functionally coupled to said second ferri-magnetic member.

7. A magnetostatic-wave device according to claim 1, wherein said first and second line sections are adjacent one another.

8. A magnetostatic-wave device according to claim 1, wherein said generally planar major surface faces away from said substrate.

9. A magnetostatic-wave device according to claim 1, wherein said ferri-magnetic member is deposited on a substantially generally planar section of said substrate and wherein said planar major surface is substantially parallel to said generally planar section of said substrate.

10. A magnetostatic-wave device according to claim 1, wherein said first and second line sections are not perpendicular to one another.

11. A magnetostatic-wave device according to claim 1, wherein the distance between said first and second line sections, as measured along an axis which is perpendicular to said direction of said DC magnetic field, varies.

12. A magnetostatic-wave device according to claim 1, wherein said first and second line sections are straight line sections and cross each other at an angle greater than zero degrees and less than 90 degrees.

13. A magnetostatic-wave device, comprising:

a substrate;

a ferri-magnetic member deposited on said substrate and having a generally planar major surface;

a magnetic field generator which generates a DC magnetic field which extends through said ferri-magnetic member along a direction which is substantially parallel to said generally planar major surface;

a signal line having an input end for receiving an electrical signal applied thereto and an output end for outputting said electric signal after it has propagated through said signal line, said signal line including at least first and second line sections extending over said major surface and being functionally coupled to said ferri-magnetic member, said first and second line sections being adjacent one another, the distance between said line sections, as measured along an axis which is perpendicular to said direction of said magnetic field, changing as said line sections extend across said generally planar major surface, such that said signal is outputted at said output end of said signal line in a filtered form when said DC magnetic field is applied to said magnetostatic-wave device.

14. A magnetostatic-wave device according to claim 13, wherein said first and second line sections are not perpendicular to one another.

15. A magnetostatic-wave device according to claim 13, wherein said first and second line sections are straight line sections and cross each other at an angle greater than zero degrees and less than 90 degrees.

* * * * *